(12) United States Patent
Tu

(10) Patent No.: US 8,026,503 B2
(45) Date of Patent: Sep. 27, 2011

(54) PHASE-CHANGE MEMORY AND METHOD OF MAKING SAME

(75) Inventor: Li-Shu Tu, Taipei County (TW)

(73) Assignee: Nanya Technology Corp., Kueishan, Tao-Yuan Hsien (TW)

(*) Notice: Subject to any disclaimer, the term of this patent is extended or adjusted under 35 U.S.C. 154(b) by 227 days.

(21) Appl. No.: 12/489,440

(22) Filed: Jun. 23, 2009

(65) Prior Publication Data
US 2010/0320435 A1    Dec. 23, 2010

(51) Int. Cl.
*H01L 45/00* (2006.01)
(52) U.S. Cl. .......... 257/3; 257/5; 257/E45.002
(58) Field of Classification Search ............ 257/1–5, 257/E45.001–E45.003
See application file for complete search history.

(56) References Cited

U.S. PATENT DOCUMENTS

| | | | | |
|---|---|---|---|---|
| 6,815,704 | B1* | 11/2004 | Chen | 257/2 |
| 7,531,825 | B2* | 5/2009 | Lai et al. | 257/4 |
| 7,791,059 | B2* | 9/2010 | Jedema et al. | 257/3 |
| 2004/0051094 | A1* | 3/2004 | Ooishi | 257/5 |
| 2008/0096344 | A1* | 4/2008 | Lai et al. | 438/238 |
| 2008/0265238 | A1* | 10/2008 | Chen et al. | 257/3 |
| 2009/0101883 | A1* | 4/2009 | Lai et al. | 257/3 |
| 2009/0148981 | A1* | 6/2009 | Lai et al. | 438/102 |
| 2009/0154227 | A1* | 6/2009 | Philipp et al. | 365/163 |
| 2009/0159867 | A1* | 6/2009 | Savransky et al. | 257/3 |

* cited by examiner

*Primary Examiner* — Anh Phung
*Assistant Examiner* — Michael Lulis
(74) *Attorney, Agent, or Firm* — Winston Hsu; Scott Margo

(57) ABSTRACT

A phase-change memory cell structure includes a bottom diode on a substrate; a heating stem on the bottom diode; a first dielectric layer surrounding the heating stem, wherein the first dielectric layer forms a recess around the heating stem; a phase-change storage cap capping the heating stem and the first dielectric layer; and a second dielectric layer covering the first dielectric layer and the phase-change storage cap wherein the second dielectric layer defines an air gap in the recess.

9 Claims, 10 Drawing Sheets

PHASE-CHANGE MEMORY AND METHOD OF MAKING SAME

BACKGROUND OF THE INVENTION

1. Field of the Invention

The present invention relates generally to semiconductor memory devices and methods for making such devices. More particularly, this invention relates to a phase-change memory (PCM) device utilizing a diode-selected array and a self-aligned method for fabricating the same.

2. Description of the Prior Art

Phase-change memory (PCM) is a type of non-volatile computer memory, which uses the unique behavior of phase-change materials such as chalcogenide glass. With the application of heat, the chalcogenide glass can be switched between two states, i.e., crystalline and amorphous states. The crystalline and amorphous states of chalcogenide glass have dramatically different electrical resistivity, and this forms the basis by which data are stored.

FIG. 1 is a schematic diagram showing a cross-sectional view of a conventional phase-change memory cell structure. As shown in FIG. 1, the phase-change memory cell structure includes a silicon substrate 10 with a bottom electrode 12 thereon. A dielectric layer 14 is formed over the bottom electrode 12 and a heating electrode 16 is formed in the dielectric layer 14. A patterned phase-change material layer 20 is provided on the dielectric layer 14. The patterned phase-change material layer 20 may be formed in a dielectric layer 18. A bottom surface of the phase-change material layer 20 partially contacts the heating electrode 16. A dielectric layer 24 is formed over the dielectric layer 18 and a top electrode 22 is formed over and in the dielectric layer 24, thereby contacting the phase-change material layer 20. During memory cell operation, a large amount of current flows through the heating electrode 16 to heat up an interface between the phase-change material layer 20 and the heating electrode 16, thereby transforming the phase of the phase-change material layer 20.

Currently, to enhance applications of phase-change memory devices, size of the memory cells of the phase change memory devices is being required to be further reduced. With size reduction of the memory cell, however, it also means working current of the memory cells should also be reduced while increasing memory cell density. One challenge for current phase-change memory technology has been the requirement of high programming current density in the active volume for switching the state of the phase-change material during a write operation. One approach is reducing the contact surface area between the heating electrode 16 and the phase change material layer 20, such as through reducing a diameter $D_0$ of the heating electrode 16, thereby maintaining adequate current density at the interface. However, diameter scalability of the heating electrode 16 is limited by ability of current photolithography.

The contact between the hot phase-change region and the adjacent dielectric is another fundamental concern. The dielectric may begin to leak current at higher temperature, or may lose adhesion when expanding at a different rate from the phase-change material.

SUMMARY OF THE INVENTION

It is one object of the invention to provide a high-density phase-change memory device with improved phase-change efficiency and reduced switching time.

It is another object of the invention to provide a cost-effective method for manufacturing such phase-change memory device in a self-aligned fashion to thereby solve the aforementioned challenges and improve electrical performance of conventional phase-change memory devices. According to the preferred embodiment of the invention, at least one conventional photo mask for patterning the phase-change material can be spared, thus making the present invention method more economical than the prior art.

According to the claimed invention, in accordance with one preferred embodiment, a phase-change memory cell structure includes a bottom diode on a substrate; a heating stem on the bottom diode; a first dielectric layer surrounding the heating stem, wherein the first dielectric layer forms a recess around the heating stem; a phase-change storage cap capping the heating stem and the first dielectric layer; and a second dielectric layer covering the first dielectric layer and the phase-change storage cap wherein the second dielectric layer defines an air gap in the recess.

In one aspect, in accordance with another embodiment of the invention, a method for fabricating a phase-change memory cell includes providing a substrate having thereon a plurality of buried address lines and a first dielectric layer on the substrate; forming a conductive electrode in the first conductive layer; removing a portion of the first dielectric layer thereby exposing a top portion of the conductive electrode; depositing a second dielectric layer on surface of the top portion and on the first dielectric layer, wherein the second dielectric layer defines a recess around the top portion and on the first dielectric layer; depositing a third dielectric layer over the second dielectric layer, wherein the third dielectric layer fills into the recess; performing a planarization process to remove a portion of the third dielectric layer and a portion of the second dielectric layer, thereby exposing a top surface of the top portion of the conductive electrode; salicidizing the top portion of the conductive electrode to form a heating stem; selectively removing the remaining third dielectric layer from the recess; forming a phase-change material layer covering the heating stem and the second dielectric layer; and performing a self-aligned etching process to etch the phase-change material layer, thereby forming a phase-change storage cap.

These and other objectives of the present invention will no doubt become obvious to those of ordinary skill in the art after reading the following detailed description of the preferred embodiment that is illustrated in the various figures and drawings.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims. Embodiments of phase-change memory devices and methods for manufacturing the same are described as below incorporating FIGS. 2-18.

Figure 1:
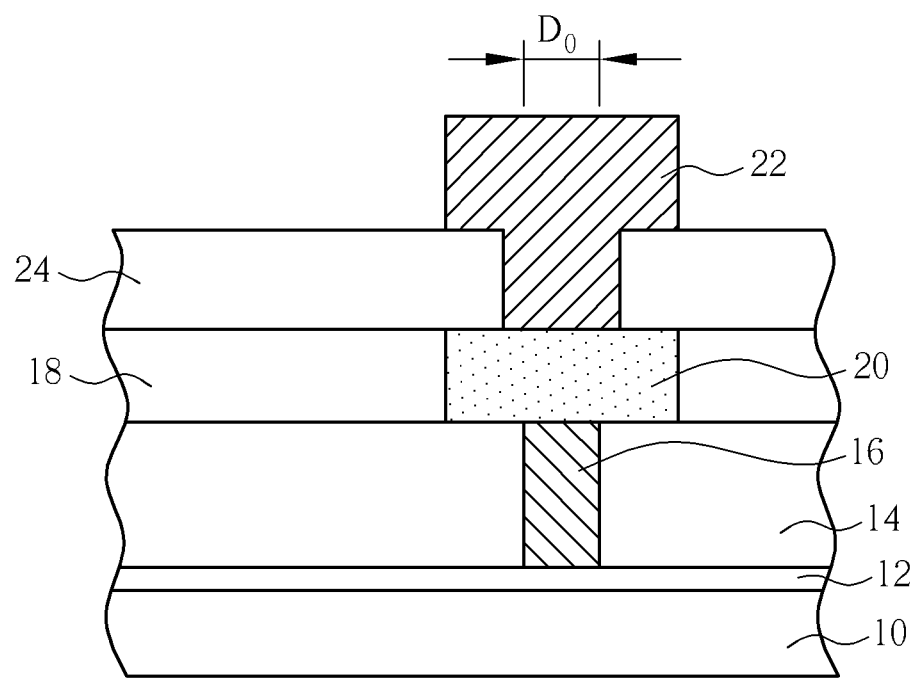
FIG. 1 is a schematic diagram showing a cross-sectional view of a conventional phase-change memory cell structure.
Figure 2:
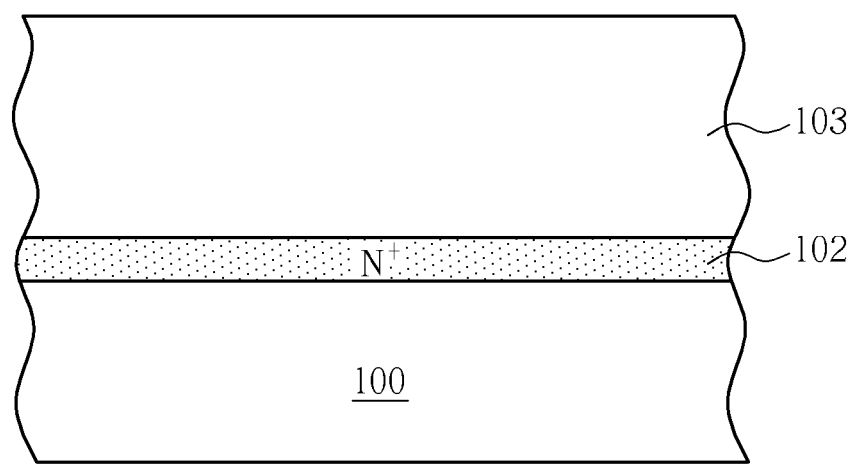
FIG. 2-16 are schematic, cross-sectional diagrams demonstrating a method of fabricating a phase-change memory cell in accordance with one preferred embodiment of this invention.

As shown in FIG. 2, a substrate 100 such as a semiconductor substrate or a P type silicon substrate is provided. Active devices such as transistors, diodes or thin films such as dielectric layers may be formed on the substrate 100 but are not illustrated here. The substrate 100 is merely illustrated as a planar substrate without showing the layers or active devices formed thereon for the sake of simplicity. A plurality of N$^-$ buried address lines or N$^+$ buried base lines 102 are formed in the substrate 100. The formation of the N$^+$ buried base lines 102 may be accomplished by conventional lithographic processes and ion implantation process. For example, a mask such as a patterned photoresist layer (not shown) defining the N$^+$ buried base lines 102 is first formed on the substrate 100. An ion implantation process is then carried out to implant N type dopants such as arsenic or phosphorus into the substrate 100 through the openings in the patterned photoresist layer. After removing the patterned photoresist layer, an anneal process may be carried out to activate the dopants. After the formation of the N$^+$ buried base lines 102, a dielectric layer 103 is then deposited over the substrate 100. The dielectric layer 103 may comprise borophosphosilicate glass (BPSG), silicon oxide, spin-on glass (SOG) or silicon nitride formed by, for example, chemical vapor deposition or spin-on methods.

Figure 3:
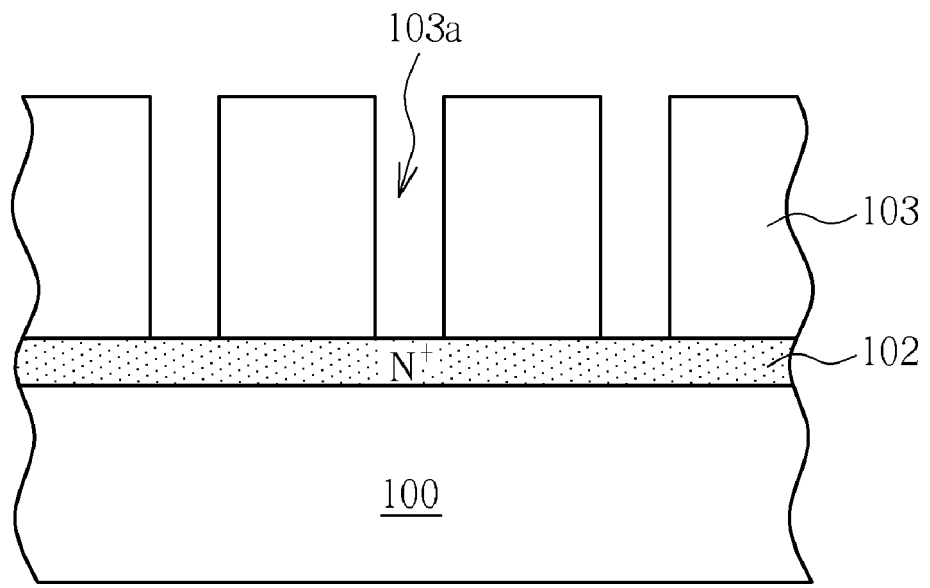

As shown in FIG. 3, subsequently, a photolithographic process (bit line photo patterning) and an etching process are carried out to form openings 103a in the dielectric layer 103. The openings 103a is formed through the dielectric layer 103 and each of the openings 103a partially exposes a portion of the underlying N$^+$ buried base lines 102.

Figure 4:
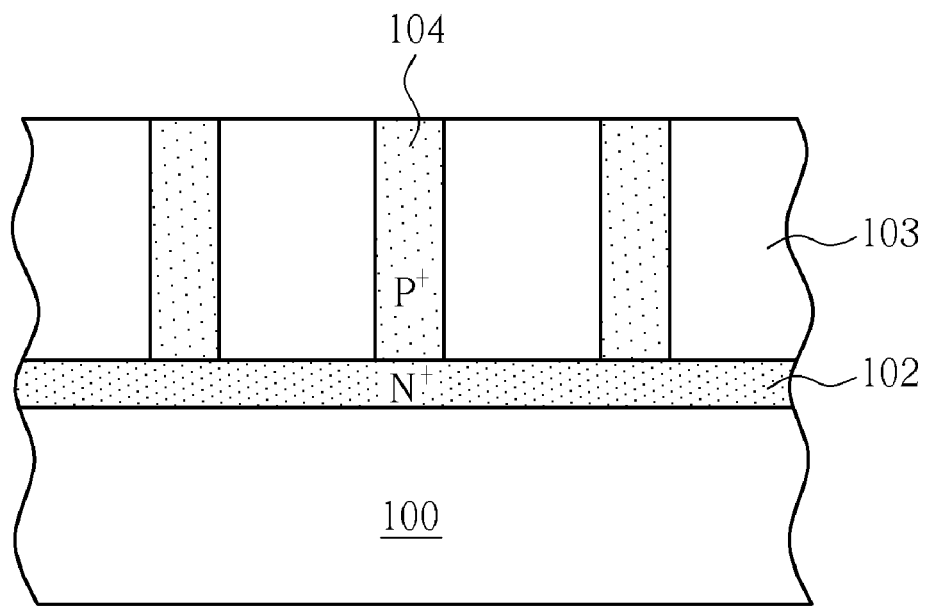

As shown in FIG. 4, a layer of conductive material is then blanketly deposited over the dielectric layer 103 and fills the openings 103a. The portion of the conductive material outside the openings 103a and above the dielectric layer 103 is then removed by a planarization process such as a chemical mechanical polishing (CMP) process, thereby leaving a conductive electrode 104 in each of the openings 103a and exposing a top surface of the conductive electrode 104. According to this embodiment, the conductive electrode 104 may comprise doped polysilicon, doped Si, doped SiGe, TiW, or TiN.

Figure 5:
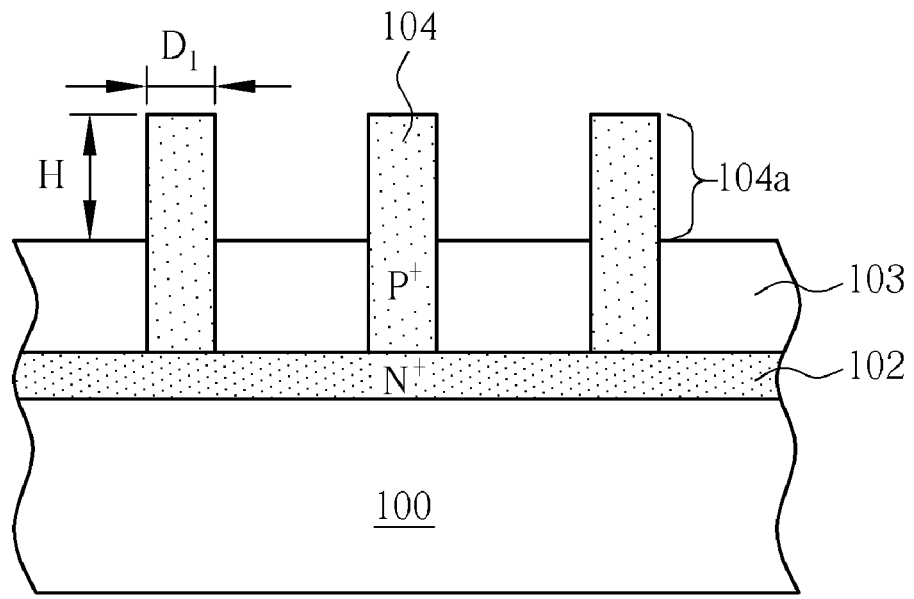

As shown in FIG. 5, an etching process is then performed to remove portions of the dielectric layer 103 and exposes a top portion 104a of each of the conductive electrodes 104. According to this embodiment, the top portion 104a of each of the conductive electrodes 104 is exposed with a height H of about 10-5000 angstroms, preferably of about 100-4000 angstroms. In addition, the conductive electrode 104 is formed with a diameter $D_1$ that is determined by the process capability of the photolithography process for forming the openings 103a. The conductive electrodes 104 may function as a heating electrode for heating up a sequentially formed phase change material layer.

Figure 6:
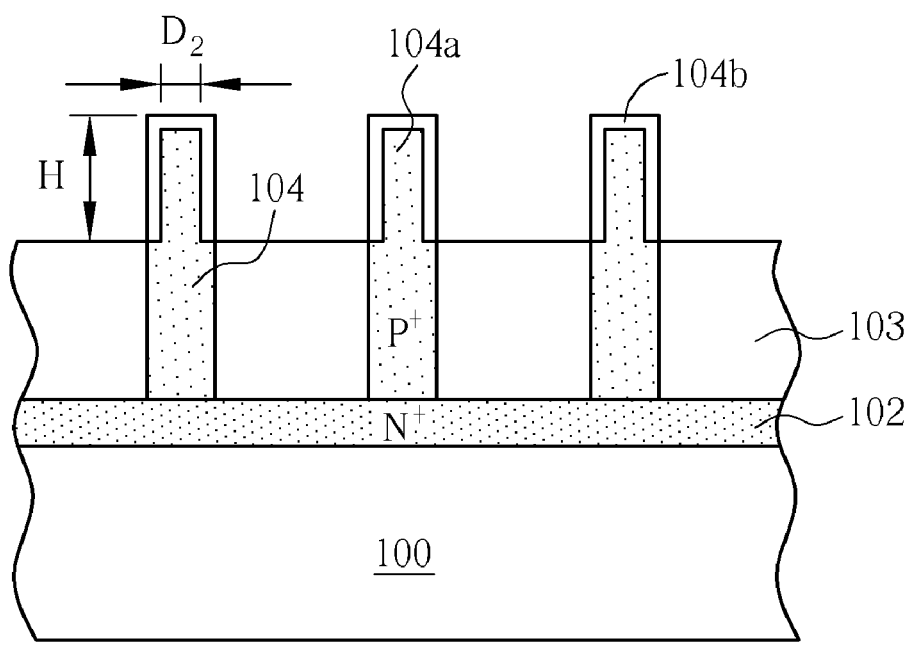
Figure 7:
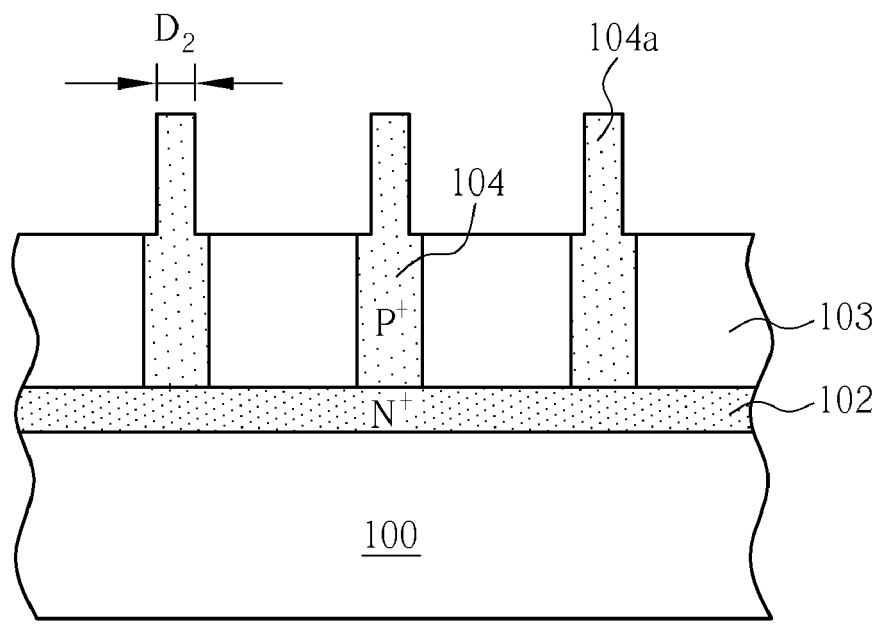

As shown in FIG. 6 and FIG. 7, an oxidation process is then performed to partially oxidize the exposed top portion 104a of each of the conductive electrodes 104, thereby forming an oxide layer 104b over the surface of the exposed top portion 104a of each of the conductive electrodes 104. The oxidation process may be a furnace oxidation process which is performed under a temperature of about 500-1000° C. for a time period of about 1-600 minutes. Process time and temperature of the oxidation process is not limited to those disclosed above and may vary according to materials used in the conductive electrode 104. The oxide layer 104b is formed on a top surface and sidewall surfaces of the exposed top portion 104a of each of the conductive electrode 104. The oxide layer 104b may slightly penetrate downward to a portion of the conductive electrode 104 below the top surface of the dielectric layer 103. The oxide layer 104b is then removed or stripped by methods known in the art such as wet etching, as shown in FIG. 7. At this point, the top portion 104a is shrunk with a reduced dimension $D_2$. Alternatively, to shrink the top portion 104a of each of the conductive electrodes 104, a wet etching process may be used instead of the oxidation process.

Figure 8:
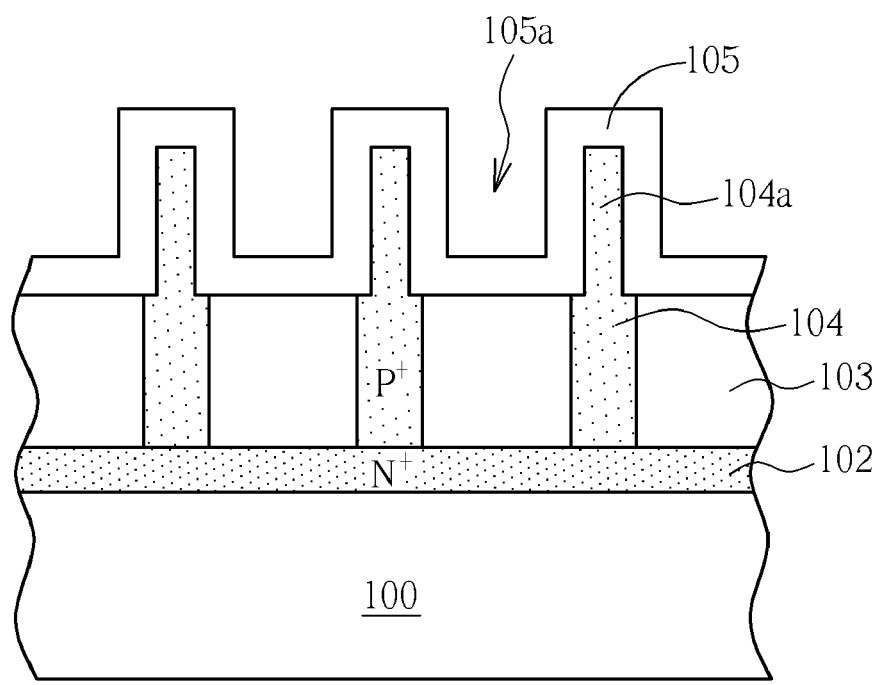

As shown in FIG. 8, a dielectric layer 105 is conformally deposited over the dielectric layer 103 and over the shrunk top portion 104a of the conductive electrode 104. The dielectric layer 105 forms a recess 105 a between neighboring top portions 104a of the conductive electrodes 104. The recess 105a is formed around each of the top portion 104a of the conductive electrode 104. According to the embodiment, the dielectric layer 105 may comprise silicon nitride or silicon oxide and may have a thickness ranging between 50 angstroms and 500 angstroms. The dielectric layer 105 may be deposited by chemical vapor deposition methods such as PECVD.

Figure 9:
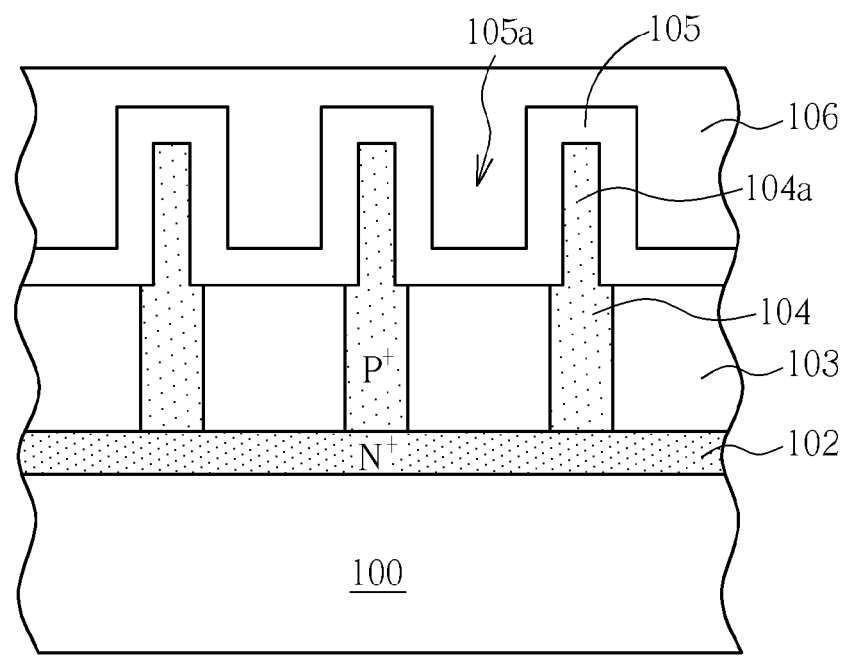

As shown in FIG. 9, a dielectric layer 106 is deposited over the dielectric layer 105 and the dielectric layer 106 fills the recess 105a. According to this embodiment, the dielectric layer 106 and the dielectric layer 105 are made of different dielectric materials. For example, the dielectric layer 105 is composed of silicon nitride and the dielectric layer 106 is composed of silicon oxide, whereby the dielectric layer 106 can be removed selectively from the top surface of the dielectric layer 105. In another embodiment, the dielectric layer 105 is composed of silicon oxide, while the dielectric layer 106 is composed of silicon nitride. Likewise, the dielectric layer 106 may be deposited by chemical vapor deposition methods such as PECVD.

Figure 10:
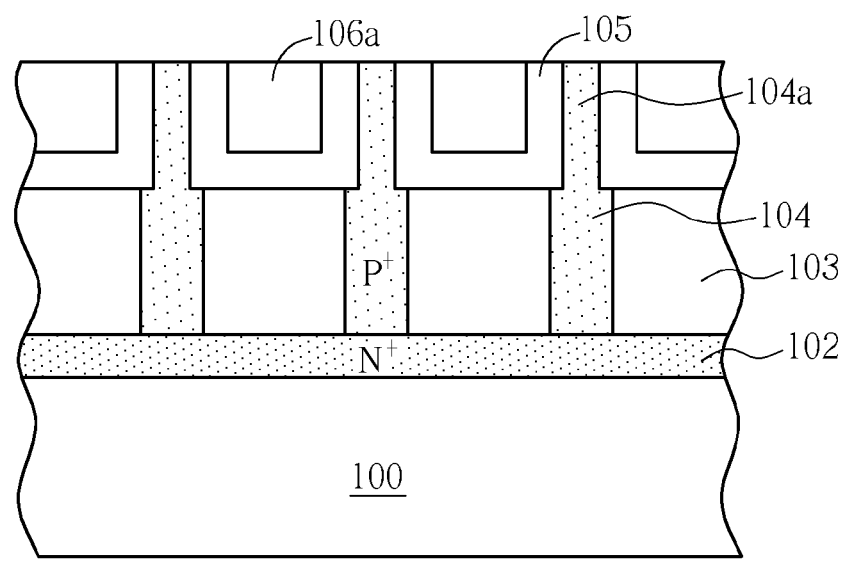

As shown in FIG. 10, a planarization process such as a chemical mechanical polishing (CMP) process is carried out to remove a portion of the dielectric layer 106 and a portion of the dielectric layer 105, thereby exposing a top surface of the top portion 104a of each of the conductive electrodes 104 and resulting in a substantially planar surface at this stage. After the CMP, the remanent dielectric layer 106a is embedded in the recess 105a between neighboring top portions 104a of the conductive electrodes 104.

Figure 11:
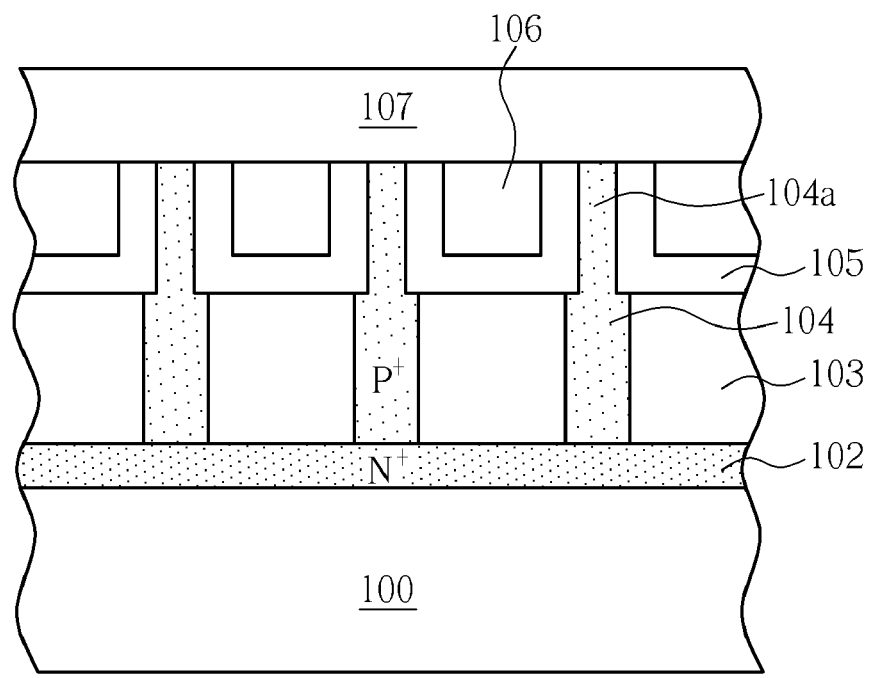
Figure 12:
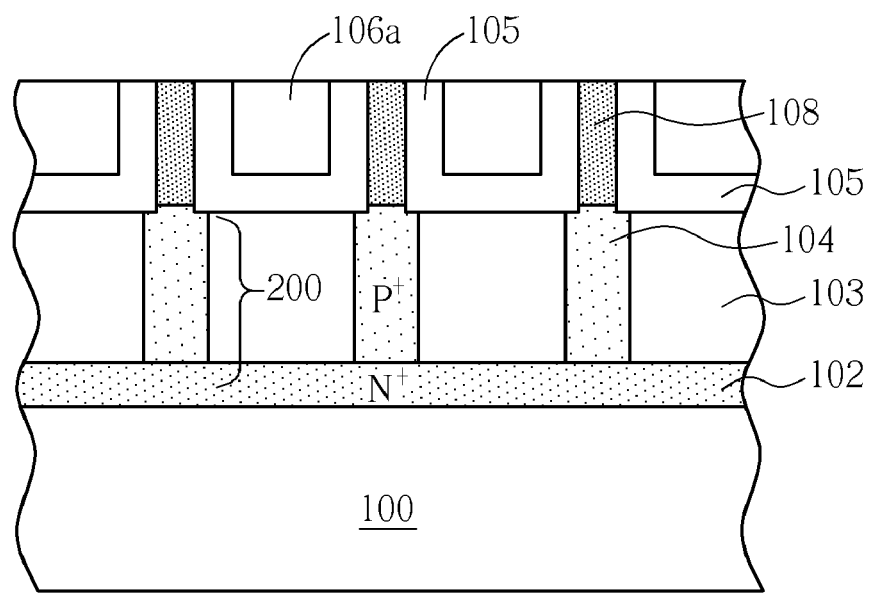

As shown in FIG. 11 and FIG. 12, a salicide process is implemented. First, a metal layer 107 is deposited over the substrate 100 by methods known in the art such as plating, sputtering, or deposition methods. According to this embodiment, the metal layer 107 may comprise cobalt, nickel, titanium or the like. The metal layer 107 directly contacts the exposed top surface of the top portion 104a of each of the conductive electrodes 104. Subsequently, as shown in FIG. 12, the metal layer 107 reacts with the top portion 104a through a rapid thermal anneal (RTP) process to transform the top portion 104a into salicide heating stem 108 that acts as a heater of the PCM cell. The un-reacted metal layer 107 is then removed to expose a top surface of the salicide heating stem 108. The salicide heating stem 108 is connected to a bottom diode 200 consisting of the conductive electrodes 104 embedded in the dielectric layer 103 and a portion of the N$^+$ buried base lines 102.

Figure 13:
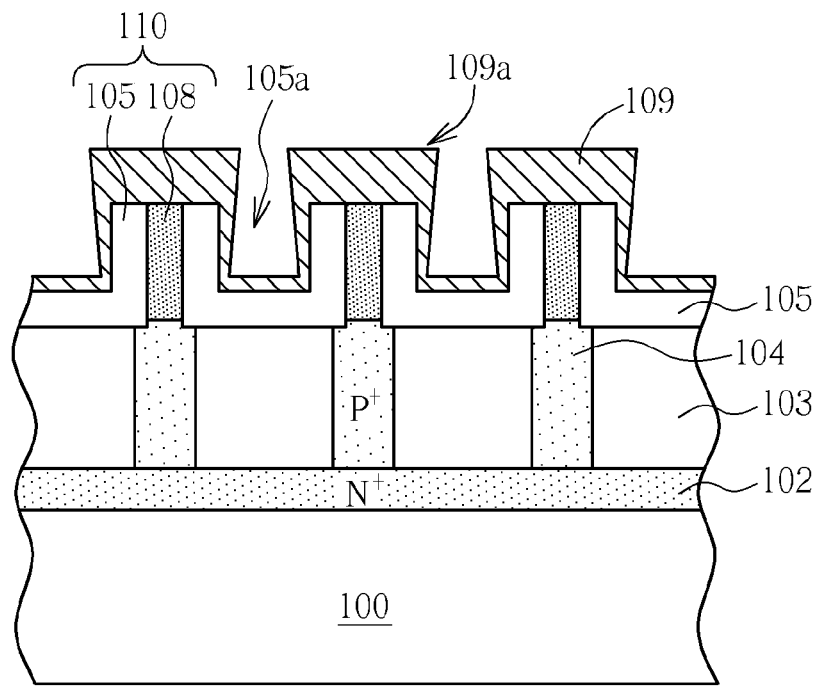

As shown in FIG. 13, after salicidizing, the remanent dielectric layer 106a inlaid in the recess 105a between neighboring top portions 104a of the conductive electrodes 104 is selectively removed from the surface of the dielectric layer 105, thereby revealing the recess 105a. The conformal dielectric layer 105 extends to the sidewalls of the salicide heating stem 108 and encompasses the salicide heating stem 108 to thereby form upward protruding cylindrical features 110. Subsequently, a non-conformal deposition process is carried out to deposit a phase-change material layer 109 over the substrate 100. According to this embodiment, the phase-change material layer 109 is not a conformal material layer, featuring a greater thickness atop the upward protruding cylindrical features 110 and a much thinner thickness at the sidewalls of the upward protruding cylindrical features 110 and at the bottom of the recess 105a, thereby forming a tapered sectional profile. The non-conformal phase-change material layer 109 also features an overhang 109a at the inlet of each of the recess 105a. Such non-conformal phase-change material layer 109 may be formed by non-conformal physical vapor deposition methods. The phase-change material layer 109 may comprise chalcogenide materials such as Ge—Sb—Te trinary chalcogenide compounds or Te—Sb binary chalcogenide compounds.

Figure 17:
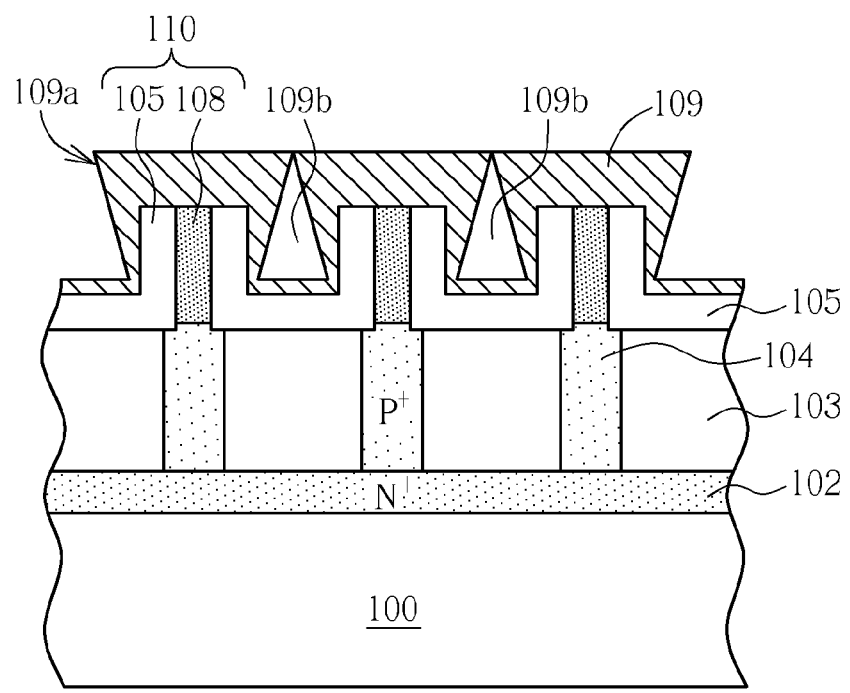
FIG. 17 is an alternative embodiment of the process as depicted in FIG. 13 according to this invention.
Figure 18:
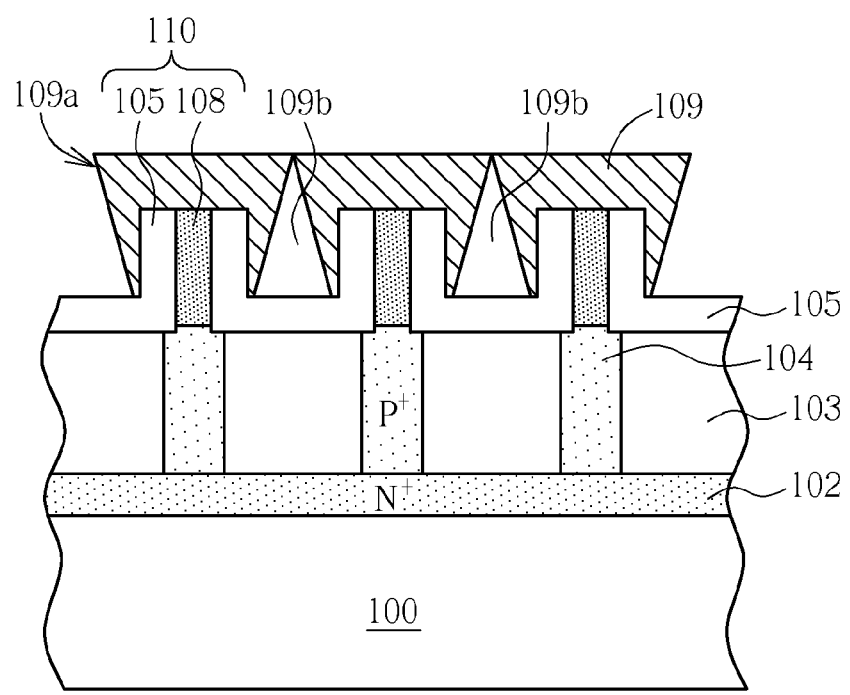
FIG. 18 is another variant of FIG. 13 in accordance with yet another embodiment of this invention.

In accordance with another embodiment of this invention, the overhang 109a may seal the recess 105a, thereby forming void 109b thereto, as shown in FIG. 17. In accordance with still another embodiment of this invention, the overhang 109a may seal the recess 105a and substantially no phase-change material is deposited at the bottom of the recess 105a, as shown in FIG. 18.

Figure 14:
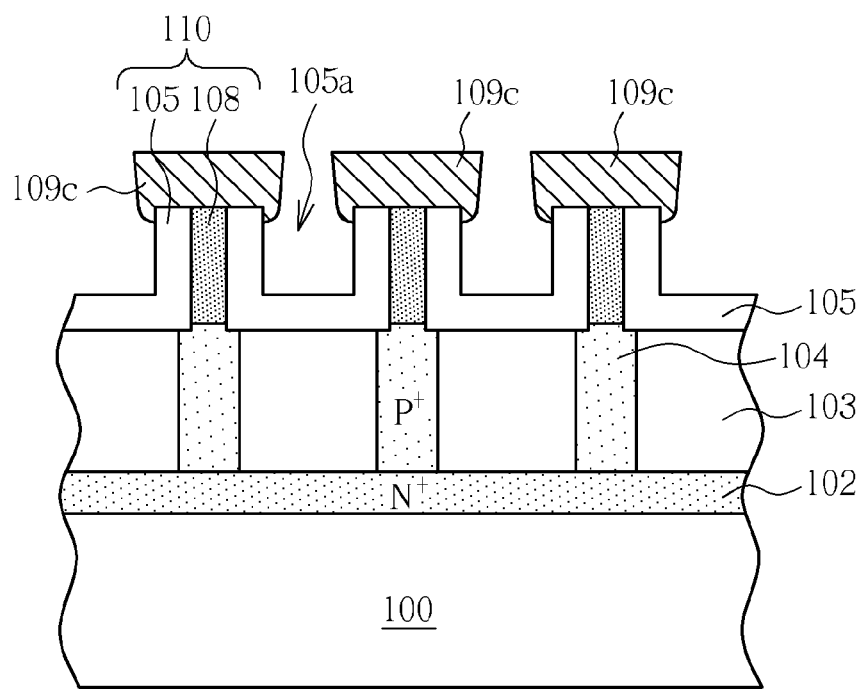
Figure 19:
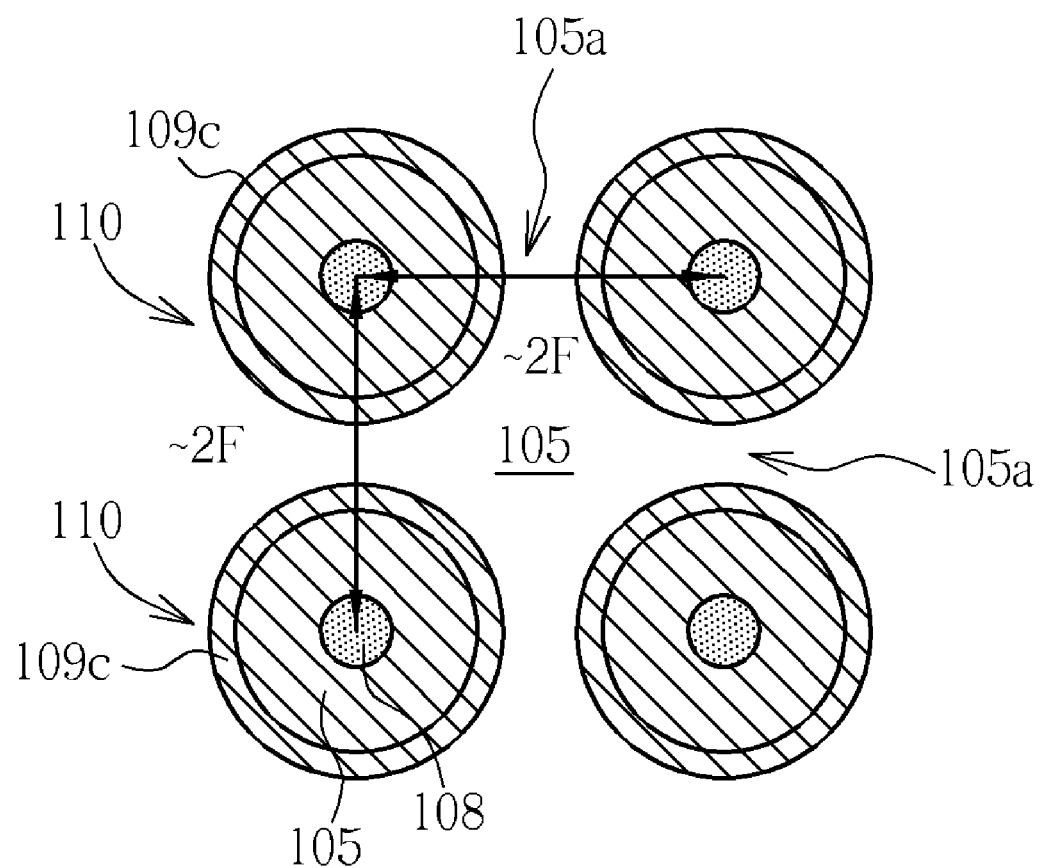
FIG. 19 is a plan view schematically showing the layout of PCM storage cap and the upward protruding cylindrical features of FIG. 14 after performing the self-aligned etching process.

As shown in FIG. 14, a self-aligned etching process such as a self-aligned dry etching process or a self-aligned wet etching process is carried out to etch the phase-change material layer 109, thereby forming a phase-change storage cap or PCM storage cap 109c and revealing the recess 105a in a self-aligned fashion. According to this embodiment, the phase-change material at the bottom of the recess 105a is completely removed. However, it is understood that in another case the phase-change material at the bottom of the recess 105a may not be completely removed. The PCM storage cap 109c may cover an upper portion of the sidewall of the upward protruding cylindrical features 110. In another embodiment, the PCM storage cap 109c may cover entire sidewall of the upward protruding cylindrical features 110 and encapsulates the upward protruding cylindrical features 110. A plan view showing the layout of PCM storage cap 109c and the upward protruding cylindrical features 110 after performing the self-aligned etching process is shown in FIG. 19.

Figure 15:
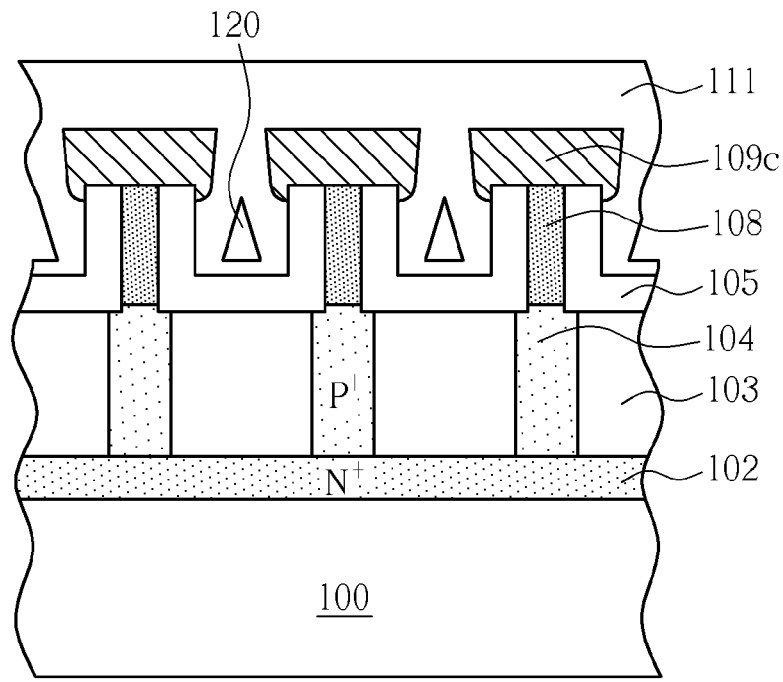

As shown in FIG. 15, after the self-aligned etching process, a dielectric layer 111 such as silicon oxide, silicon oxy-nitride, silicon nitride or low-k dielectrics is deposited over the substrate 100 to seal the recess 105a, thereby forming air gap 120 inside the recess 105a. The air gap 120 may be vacuum or near vacuum depending upon the vacuum condition during the deposition of the dielectric layer 111. The air gap 120 surrounds the upward protruding cylindrical features 110 and may act as a heat insulator that can effectively prevent heat generated from a salicide heating stem 108 from interfering neighboring cells during the heating or setting of the phase-change material of a particular cell bit. Furthermore, the phase-change material may cover the sidewall of the upward protruding cylindrical features 110 and provide better heat insulating characteristic owing to the low thermal conductivity of the phase-change material.

Figure 16:
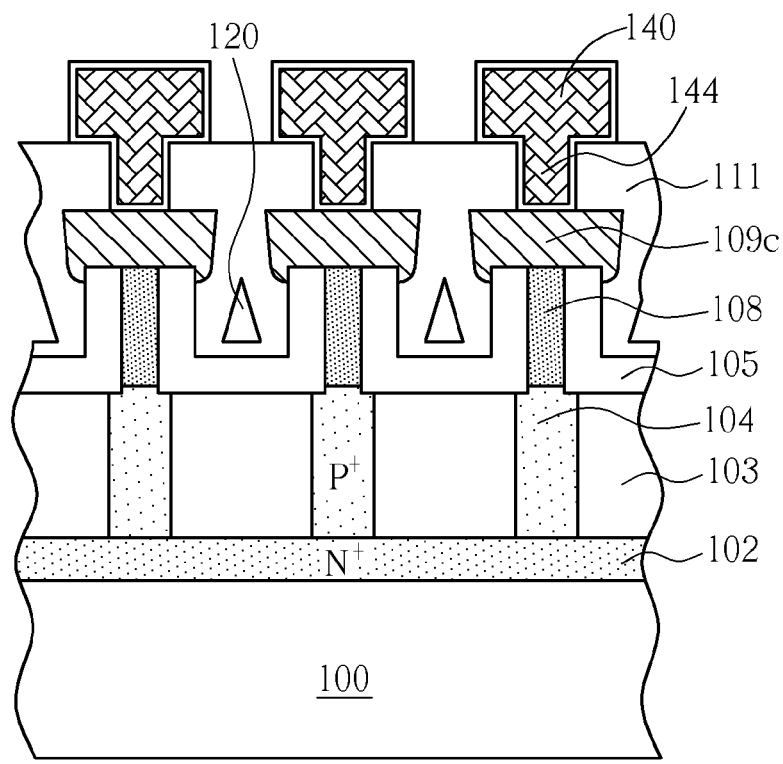

As shown in FIG. 16, a plurality of bit lines 140 are formed on the dielectric layer 111 and each of the plurality of bit lines 140 is electrically connected with corresponding PCM storage cap 109c of a PCM cell through corresponding via/contact plug 144 that is formed in the dielectric layer 111. According to this embodiment, the bit lines 140 may be composed of metals such as aluminum, copper, tungsten, silver, gold or alloys thereof. The via/contact plug 144 may be composed of aluminum, copper or tungsten.

In sum, the advantages of using this invention include: (1) at least one photo mask can be spared because the PCM storage cap is defined by self-aligned method, thus making the present invention method more economical; (2) the space between cells can be shrunk to minimum because the PCM storage cap is formed self-aligned to the salicide heating stem 108 and the bottom diode 200, thereby increasing the cell packing density; and (3) the heater, i.e., the salicide heating stem 108, is surrounded by air gap and, optionally, the phase-change material with low thermal conductivity, thereby avoiding cross talk between cells during operation and improving the phase-change efficiency.

Those skilled in the art will readily observe that numerous modifications and alterations of the device and method may be made while retaining the teachings of the invention.

What is claimed is:

1. A phase-change memory cell structure, comprising:
   a bottom diode on a substrate;
   a heating stem on the bottom diode;
   a first dielectric layer surrounding the heating stem, wherein the first dielectric layer forms a recess around the heating stem, wherein the first dielectric layer extends to a sidewall of the heating stem and encompasses the heating stem to form an upward protruding cylindrical feature;
   a phase-change storage cap capping the heating stem and the first dielectric layer, wherein the phase-change storage cap at least covers an upper portion of a sidewall of the upward protruding cylindrical feature underneath the phase-change storage cap; and
   a second dielectric layer covering the first dielectric layer and the phase-change storage cap wherein the second dielectric layer defines an air gap in the recess.

2. The phase-change memory cell structure according to claim 1 wherein the phase-change storage cap has a tapered profile.

3. The phase-change memory cell structure according to claim 1 wherein the phase-change storage cap comprises chalcogenide compounds.

4. The phase-change memory cell structure according to claim 1 wherein the bottom diode comprises a conductive electrode.

5. The phase-change memory cell structure according to claim 4 wherein the conductive electrode comprises doped polysilicon, doped Si, doped SiGe, TiW, or TiN.

6. The phase-change memory cell structure according to claim 4 wherein the conductive electrode is electrically connected to an $N^+$ base line buried in the substrate.

7. The phase-change memory cell structure according to claim 1 wherein the first dielectric layer comprises silicon oxide or silicon nitride.

8. The phase-change memory cell structure according to claim 1 wherein the first dielectric layer has a thickness ranging between 50 angstroms and 500 angstroms.

9. The phase-change memory cell structure according to claim 1 wherein the second dielectric layer comprises silicon oxide, silicon oxy-nitride, silicon nitride or low-k dielectrics.

* * * * *